United States Patent
Lim et al.

(10) Patent No.: US 9,209,081 B2
(45) Date of Patent: Dec. 8, 2015

(54) SEMICONDUCTOR GRID ARRAY PACKAGE

(71) Applicants: Fui Yee Lim, Bandar Sri Damasara (MY); Weng Foong Yap, Phoenix, AZ (US)

(72) Inventors: Fui Yee Lim, Bandar Sri Damasara (MY); Weng Foong Yap, Phoenix, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 158 days.

(21) Appl. No.: 13/773,603

(22) Filed: Feb. 21, 2013

(65) Prior Publication Data
US 2014/0231980 A1 Aug. 21, 2014

(51) Int. Cl.
*H01L 21/78* (2006.01)
*H01L 23/31* (2006.01)
*H01L 23/538* (2006.01)
*H01L 25/065* (2006.01)

(52) U.S. Cl.
CPC ............ *H01L 21/78* (2013.01); *H01L 23/3107* (2013.01); *H01L 23/5389* (2013.01); *H01L 25/065* (2013.01); *H01L 2224/48091* (2013.01); *H01L 2224/48137* (2013.01); *H01L 2224/73265* (2013.01)

(58) Field of Classification Search
CPC .................................................. H01L 21/44
USPC .......................................... 257/777, 723, 724
See application file for complete search history.

(56) References Cited

U.S. PATENT DOCUMENTS

| | | | | |
|---|---|---|---|---|
| 5,989,939 A | * | 11/1999 | Fjelstad | 438/117 |
| 6,001,723 A | * | 12/1999 | Kelkar et al. | 438/612 |
| 2003/0102569 A1 | * | 6/2003 | Reyes et al. | 257/777 |
| 2005/0269687 A1 | * | 12/2005 | Forcier | 257/701 |
| 2009/0014858 A1 | | 1/2009 | Boon | |
| 2009/0305464 A1 | * | 12/2009 | Howard et al. | 438/109 |
| 2011/0068461 A1 | * | 3/2011 | England | 257/700 |
| 2011/0316117 A1 | | 12/2011 | Kripesh | |

OTHER PUBLICATIONS

Cheng-Hsiang Liu; Hong-Da Chang; Hsin-Yi Liao; Kuo-Hsiang Li; Chen-Han Lin; Wei-Yu Chen; Tse-Yuan Lin; , "Novel approaches of wafer level packaging for MEMS devices," Electronic Components and Technology Conference (ECTC), 2012 IEEE 62nd , vol., No., pp. 1260-1266, May 29, 2012-Jun. 1, 2012.

* cited by examiner

*Primary Examiner* — William Harriston
(74) *Attorney, Agent, or Firm* — Charles Bergere

(57) ABSTRACT

A semiconductor grid array package has a first housing member with a cavity that has a cavity floor and cavity walls. A semiconductor die is affixed to the cavity floor. A second housing member is molded to the first housing member and covers an interface surface of the die. Electrically conductive runners are mounted to an external surface of the second housing member. The runners have a wire contacting area and an external connector contacting area. Bond wires are selectively bonded to the external connection pads of the semiconductor die and selectively connected to the wire contacting area of the runners. External electrical connectors are mounted to a designated external connector contacting area.

16 Claims, 7 Drawing Sheets

SEMICONDUCTOR GRID ARRAY PACKAGE

BACKGROUND OF THE INVENTION

The present invention relates generally to semiconductor packaging and, more particularly, to a semiconductor grid array package.

One type of semiconductor package is a Quad Flat Package (QFP), which is formed with a semiconductor die mounted to a lead frame. The lead frame is formed from a sheet of metal that has a die attach pad often called a flag and arms that attach the flag to a frame. Leads of the lead frame are wire bonded to electrodes of the die to provide a means of easily electrically connecting the die to circuit boards and the like. After the electrodes and leads are wire bonded, the semiconductor die and leads are encapsulated in a compound (material) such as a plastic material leaving only sections of the leads exposed. These exposed leads are cut from the frame of the lead frame (singulated) and bent for ease of connection to a circuit board. However, the QFP structure limits the number of leads, and therefore the number of package external electrical connections, that can be used for a specific package size.

Grid array packages have been developed as an alternative to QFPs. Grid array packages allow for an increased number of external electrical connections while maintaining or even decreasing the package size. Such grid array packages include Pin Grid Arrays, Ball Grid Array and Land Grid Arrays. Most conventional grid array packages are substrate based and are relatively expensive when compared with lead frame based packages. However, because of the high density of external electrical connections of lead frame based grid array packages, soldering shorts may occur between adjacent external electrical connections when they are device is soldered to a circuit board. Further, the external electrical connections of the lead frame based grid array packages are typically fabricated from a thin single sheet of conductive material, such as copper, and these connections may not be sufficiently held within the mold compound such that they can become loose. Also, the encapsulating compound may bleed (resin bleed) during molding thereby affecting yield and reliability.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
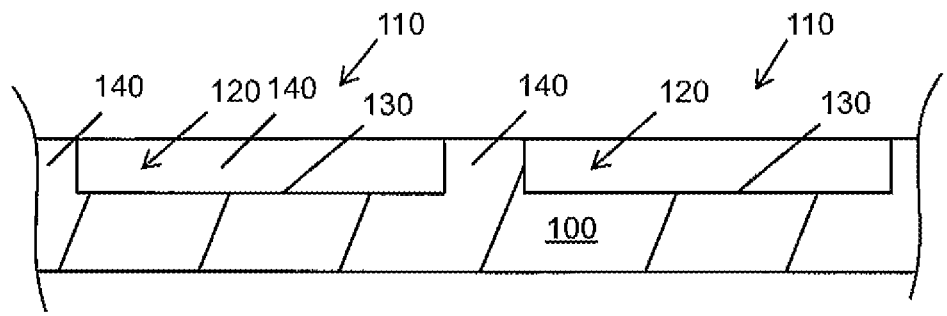
FIG. 1 is a cross-sectional side view of a sheet of die carriers, in accordance with a first preferred embodiment of the present invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides for a semiconductor die grid array package comprising a first housing member with a cavity therein, the cavity having a cavity floor at least partially surrounded by walls of the cavity. There is a semiconductor die having a mounting surface and an opposite interface surface with external connection pads, wherein the mounting surface is fixed to the cavity floor. A second housing member is molded to the first housing member and covers at least the interface surface. There are a plurality of electrically conductive runners mounted to an external surface of the second housing member, the runners having a wire contacting area and an external connector contacting area. Bond wires are selectively bonded to the external connection pads of the semiconductor die and selectively connected to the wire contacting area of the runners. There are also external electrical connectors each mounted to a said external connector contacting area.

In another embodiment, the present invention provides for a method for manufacturing a semiconductor die grid array package. The method includes providing a die carrier with a cavity therein, the die carrier providing a first housing member and wherein the cavity has a cavity floor at least partially surrounded by cavity walls. The method performs a process of placing a semiconductor die in the cavity, the semiconductor die having a mounting surface and an opposite interface surface with external connection pads, wherein the mounting surface is fixed to the cavity floor. Bond wires are selectively bonded to the external connection pads and a molding a second housing member to the die carrier is performed so that the second housing member covers the interface surface and lengths of the bond wires. There is then performed a process of depositing a plurality of electrically conductive runners to an external surface of the second housing member, these runners have a wire contacting area and an external connector contacting area. These bond wires are also selectively connected to the wire contacting area of the runners. The method then performs a process of mounting external electrical connectors to a respective external connector contacting area.

Referring to FIG. 1, a cross-sectional side view of a molded sheet 100 of die carriers, in accordance with a first preferred embodiment of the present invention, is illustrated. The sheet 100 is formed from a molded compound and includes individual die carriers (first housing members) 110 integrally formed in the molded sheet 100. Each of the individual die carriers 110 has a cavity 120 therein. Each cavity 120 has a cavity floor 130 surrounded by cavity walls 140 and adjacent cavities 120 share a common cavity wall.

Figure 2:
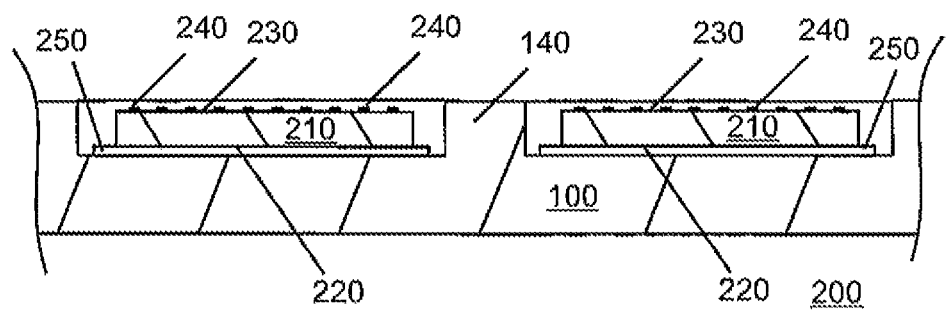
FIG. 2 is a cross-sectional side view of a populated sheet of die carriers including semiconductor dies mounted to the sheet of die carriers of FIG. 1, in accordance with the first preferred embodiment of the present invention.

FIG. 2 shows a cross-sectional side view of a populated sheet of die carriers 200 including semiconductor dies 210 mounted to the sheet 100 of die carriers, in accordance with the first preferred embodiment of the present invention. Each semiconductor die 210 has a mounting surface 220 and an opposite interface surface 230 with external connection pads 240. Each semiconductor die 210 is mounted in a respective cavity 120. More specifically, the mounting surface 220 is fixed to the cavity floor 130 typically by an epoxy resin or a double sided adhesive film 250.

Figure 3:
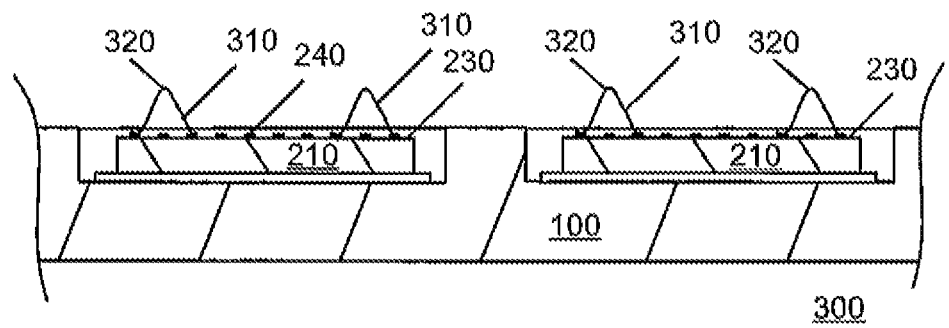
FIG. 3 is a cross-sectional side view of a wire bonded assembly formed from the populated sheet of die carriers of FIG. 2, in accordance with the first preferred embodiment of the present invention.

Referring to FIG. 3, a cross-sectional side view of a wire bonded assembly 300 formed from the populated sheet of die carriers 200, in accordance with the first preferred embodiment of the present invention, is shown. The wire bonded assembly 300 includes bond wires 310 selectively bonded to the external connection pads 240 of the semiconductor dies 210. Bonding of the bond wires 310 to the external connection pads 240 is typically provided by ball bonding, wedge bonding or any other wire bonding techniques known in the art. Furthermore, each of the bond wires 310 illustrated is a bridging wire that couples a first one of the external connection pads 240 to a second one of the external connection pads 240. Such bridging wires are beneficial especially when bridging two power rails (VDD or GND) as will be apparent to a person skilled in the art. In addition, these bridging wires can allow for relatively long unsupported bond wires 310 that can have an intermediate section (a zenith) 320 spaced from the interface surface 230 and positioned outside of the cavity 120.

Figure 4:
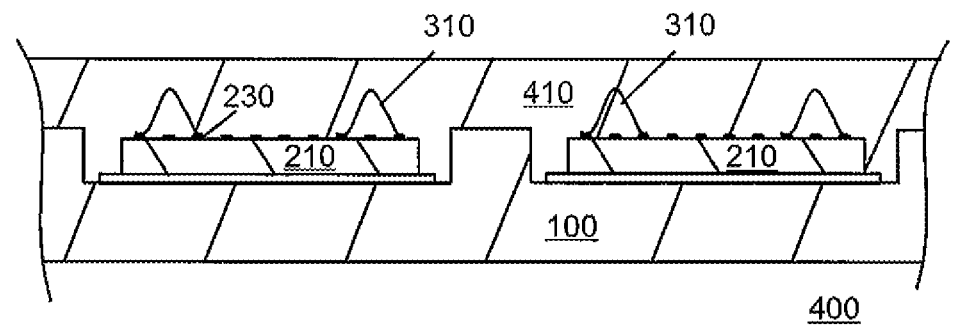
FIG. 4 is a cross-sectional side view of a molded wire bonded assembly formed from the wire bonded assembly of FIG. 3, in accordance with the first preferred embodiment of the present invention.

FIG. 4 is an illustration of a cross-sectional side view of a molded wire bonded assembly 400 formed from the wire bonded assembly 300, in accordance with the first preferred embodiment of the present invention. The molded wire bonded assembly 400 includes a molding compound (second housing members) 410 to the sheet 100 of die carriers so that the molding compound 410 covers the interface surface 230 and lengths of the bond wires 310.

Figure 5:
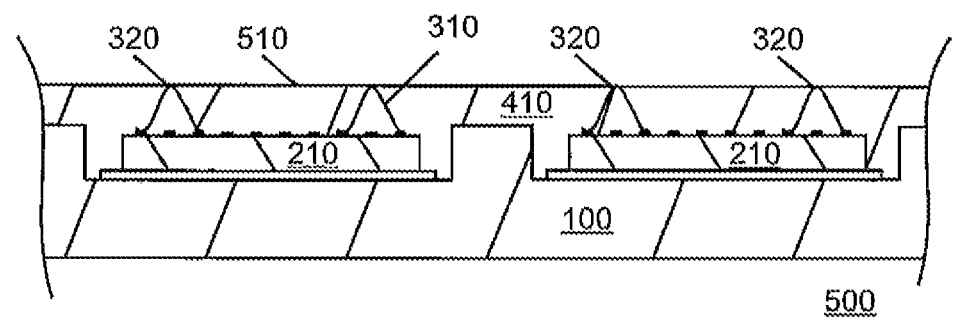
FIG. 5 is a cross-sectional side view of a ground housing wire bonded assembly formed from the molded wire bonded assembly of FIG. 4, in accordance with the first preferred embodiment of the present invention.

Referring to FIG. 5, there is illustrated a cross-sectional side view of a ground housing wire bonded assembly 500 formed from the molded wire bonded assembly 400, in accordance with the first preferred embodiment of the present invention. The ground housing wire bonded assembly 500 is the molded wire bonded assembly 400 with part of an upper surface 510 of the molding compound 410 removed, by a grinding process, in order to expose the intermediate sections 320 of the bond wires 310. This grinding process also skims or grinds away part of the intermediate sections 320 thereby cleaning these intermediate sections 320 to allow for good electrical contact with a sputter coating.

Figure 6:
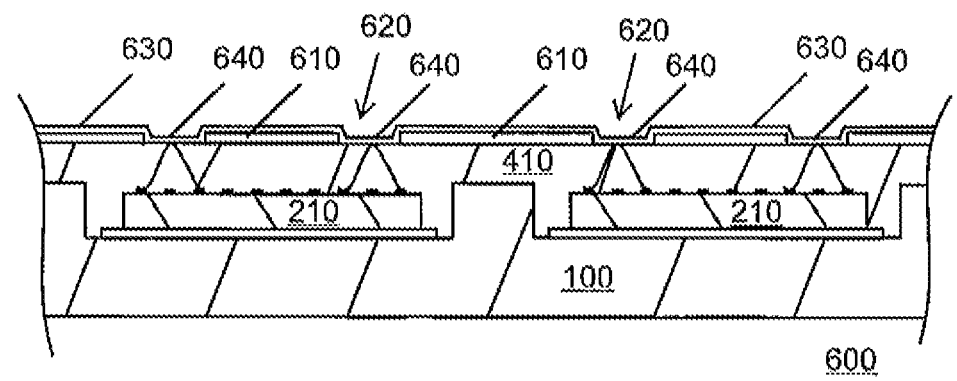
FIG. 6 is a cross-sectional side view of a sputter coated wire bonded assembly formed from the ground housing wire bonded assembly of FIG. 5, in accordance with the first preferred embodiment of the present invention.

FIG. 6 is a cross-sectional side view of a sputter coated wire bonded assembly 600 formed from the ground housing wire bonded assembly 500, in accordance with the first preferred embodiment of the present invention. The sputter coated wire bonded assembly 600 has a dielectric mask 610 with exposed regions 620 which leave the cleaned intermediate sections 320 of the bond wires 310 exposed. Partially formed electrically conductive runners (sputter coatings) 630 are deposited over the mask 610 and in the exposed regions 620. The sputter coatings 630 which, in the exposed regions 620, form a wire contacting area 640 electrically connected to respective cleaned intermediate sections 320 of the bond wires 310.

Figure 7:
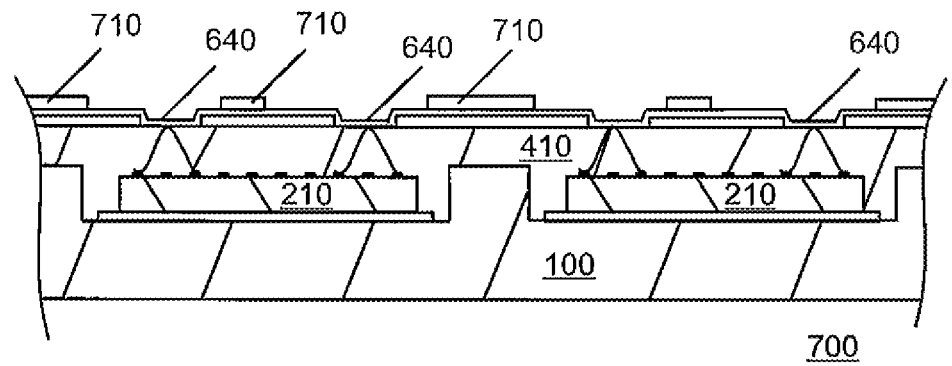
FIG. 7 is a cross-sectional side view of a masked wire bonded assembly formed from the sputter coated wire bonded assembly of FIG. 6, in accordance with the first preferred embodiment of the present invention.

FIG. 7 is a cross-sectional side view of a masked wire bonded assembly 700 formed from the sputter coated wire bonded assembly 600, in accordance with the first preferred embodiment of the present invention. The masked wire bonded assembly 700 has a sacrificial plating mask 710 positioned over regions of the formed electrically conductive runners (sputter coatings) 630 that are required to be removed.

Figure 8:
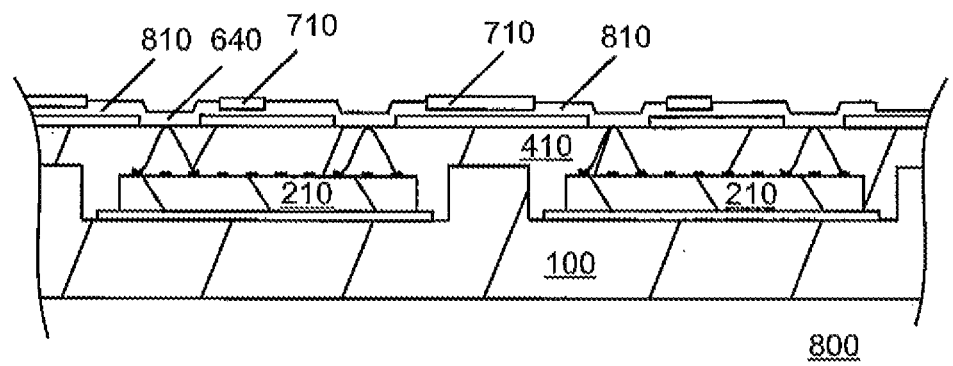
FIG. 8 is a cross-sectional side view of a plated wire bonded assembly formed from the masked wire bonded assembly of FIG. 7, in accordance with the first preferred embodiment of the present invention.

FIG. 8 illustrates a cross-sectional side view of a plated wire bonded assembly 800 formed from the masked wire bonded assembly 700, in accordance with the first preferred embodiment of the present invention. As shown, there is a plating 810 deposited in exposed regions of the sacrificial plating mask 710. The plating 810 is typically around 10 microns thick which is strategically deposited over the sputter coatings 630 of typically 2 microns thickness.

Figure 9:
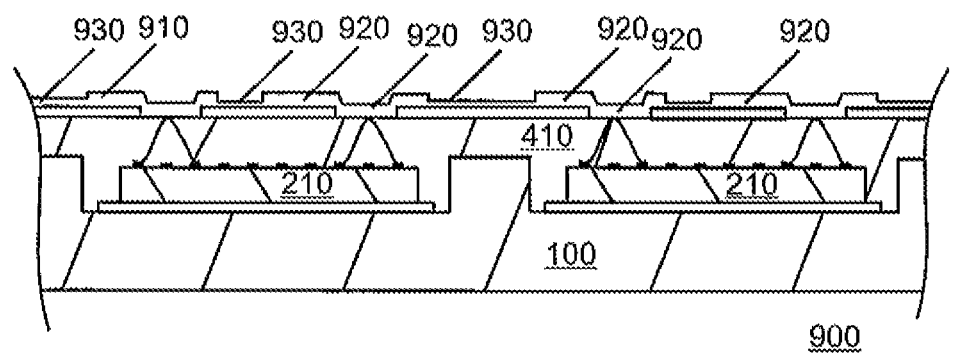
FIG. 9 is a cross-sectional side view of an unmasked plated wire bonded assembly formed from the plated wire bonded assembly of FIG. 8, in accordance with the first preferred embodiment of the present invention.

FIG. 9 is a cross-sectional side view of an unmasked plated wire bonded assembly 900 formed from the plated wire bonded assembly 800, in accordance with the first preferred embodiment of the present invention. The unmasked plated wire bonded assembly 900 has the sacrificial plating mask 710 removed by an etching or stripping process that is well known in the art. As shown, there is an uneven covering of an electrically conductive deposit 910 on the upper surface 510.

This electrically conductive deposit 910 includes thicker regions 920 of 12 microns provided by a combination of the sputter coating 630 and plating 810 and thinner regions 930 of 2 microns provided by the sputter coating 630.

Figure 10:
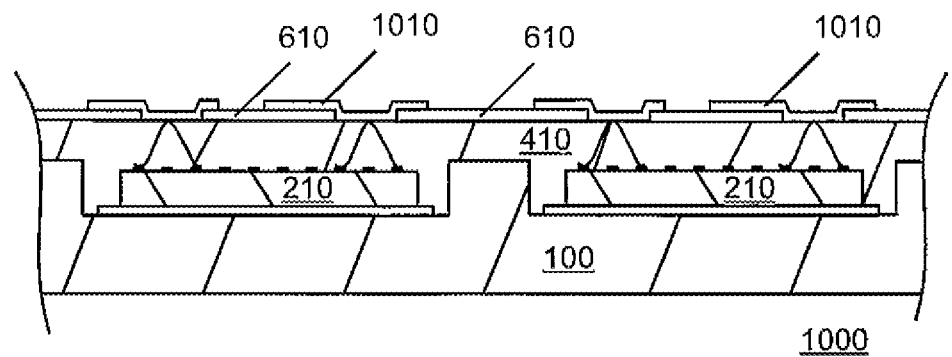
FIG. 10 is a cross-sectional side view of an etched wire bonded assembly formed from the unmasked plated wire bonded assembly of FIG. 9, in accordance with the first preferred embodiment of the present invention.

FIG. 10 is a cross-sectional side view of an etched wire bonded assembly 1000 formed from the unmasked plated wire bonded assembly 900, in accordance with the first preferred embodiment of the present invention. The etched wire bonded assembly 1000 is the unmasked plated wire bonded assembly 900 after an etching process has removed about 3 microns of the electrically conductive deposit 910. As a result, electrically conductive deposit 910 forms numerous electrically conductive runners 1010 having, in this embodiment, a thickness of about 9 microns. However, the runners 1010 may have any suitable thickness as will be apparent to a person skilled in the art.

Figure 11:
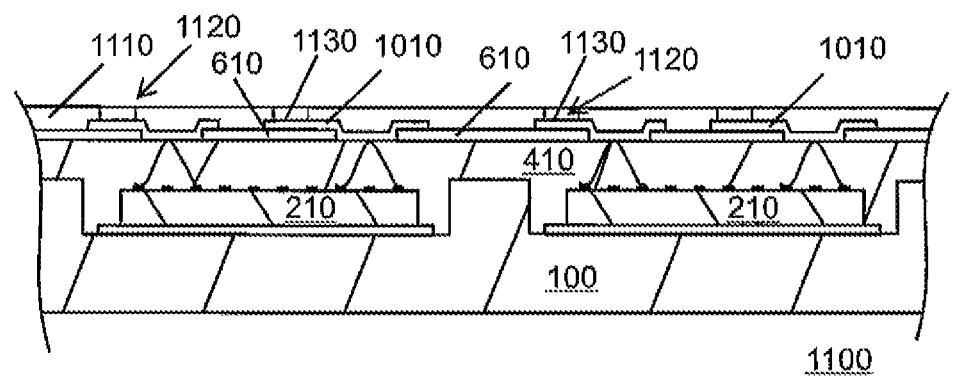
FIG. 11 is a cross-sectional side view of a dielectric covered wire bonded assembly formed from the etched wire bonded assembly of FIG. 10, in accordance with the first preferred embodiment of the present invention.

FIG. 11 is an illustration of a cross-sectional side view of a dielectric covered wire bonded assembly 1100 formed from the etched wire bonded assembly 1000, in accordance with the first preferred embodiment of the present invention. The dielectric covered wire bonded assembly 1100 has a dielectric covering 1110 that selectively covers the electrically conductive runners 1010 and dielectric mask 610. Apertures 1120 in the dielectric covering 1110 allow external access to the sections of the electrically conductive runners 1010 that provide external connector contacting areas 1130.

Figure 12:
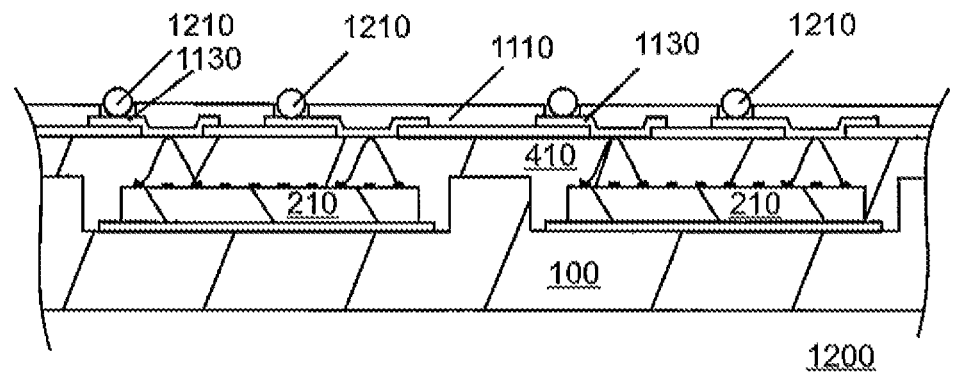
FIG. 12 is a cross-sectional side view of an array of semiconductor die grid array packages formed from the dielectric covered wire bonded assembly of FIG. 11, in accordance with the first preferred embodiment of the present invention.

FIG. 12 shows a cross-sectional side view of an array of semiconductor die grid array packages 1200 formed from the dielectric covered wire bonded assembly 1100, in accordance with the first preferred embodiment of the present invention. The array of semiconductor die grid array packages 1200 has external electrical connectors in the form of solder balls 1210 each mounted to a designated external connector contacting area 1130.

Figure 13:
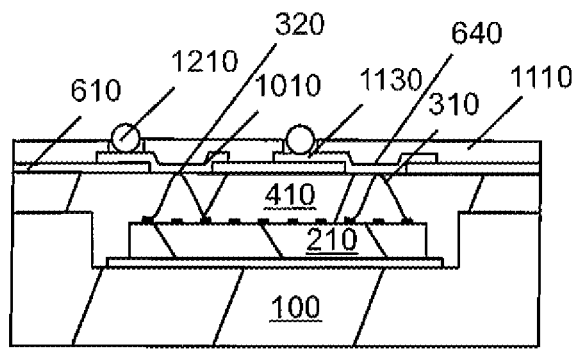
FIG. 13 is a cross-sectional side view of a semiconductor die grid array package formed from separating the array of semiconductor die grid array packages of FIG. 12, in accordance with the first preferred embodiment of the present invention.

FIG. 13 is a cross-sectional side view of a semiconductor die grid array package 1300 formed from separating the array of semiconductor die grid array packages 1200, in accordance with the first preferred embodiment of the present invention. The semiconductor die grid array package 1300 includes the first housing member 110 (formed from the individual die carriers) with the semiconductor die 210 fixed to the cavity floor 130. The electrically conductive runners 1010 are mounted to the external surface of the second housing member 410 (molding compound) and the bond wires 310 are selectively bonded to the external connection pads 240 of the semiconductor die 210 and selectively connected a wire contacting area 640. Also as shown, the semiconductor die grid array package 1300 has the external electrical connectors (in the form of solder balls 1210) each mounted to one of the external connector contacting areas 1130, which forms a ball grid array (BGA).

As previously mentioned, the bond wires 310 are typically bridging wires that couple a first one of the external connection pads 240 to a second one of the external connection pads 240. Each bridging wire is bonded to the first one of the external connection pads 240 and an opposite second end of the bringing wire is bonded to the second one of the external connection pads 240. Furthermore, as shown, the intermediate section 320 of each bringing wire is connected to the wire contacting area 640 by the sputter coating 630 that partially forms the runners 1010.

Figure 14:
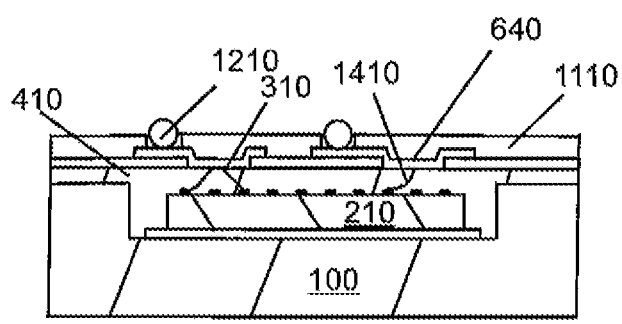
FIG. 14 is a cross-sectional side view of a semiconductor die grid array package, in accordance with a second preferred embodiment of the present invention.

Referring to FIG. 14, there is illustrated a cross-sectional side view of a semiconductor die grid array package 1400, in accordance with a second preferred embodiment of the present invention. The semiconductor die grid array package 1400 is similar to the semiconductor die grid array package 1300 and is made in the same way, therefore to avoid repetition only the differences will described. In this embodiment the bond wires 310 include a stump wire 1410 with a first end bonded to the one of the external connection pads 240 and an opposite second end connected to the wire contacting area 640 by the sputter coating 630 that partially forms the runners 1010. Thus, since during manufacture of the semiconductor die grid array package 1400 the stump wire 1410 is temporarily unsupported (before the molding compound 410 is applied), the stump wire 1410 is relatively short and therefore the thickness of the molding compound 410 is less than used in the semiconductor die grid array package 1300.

Figure 15:
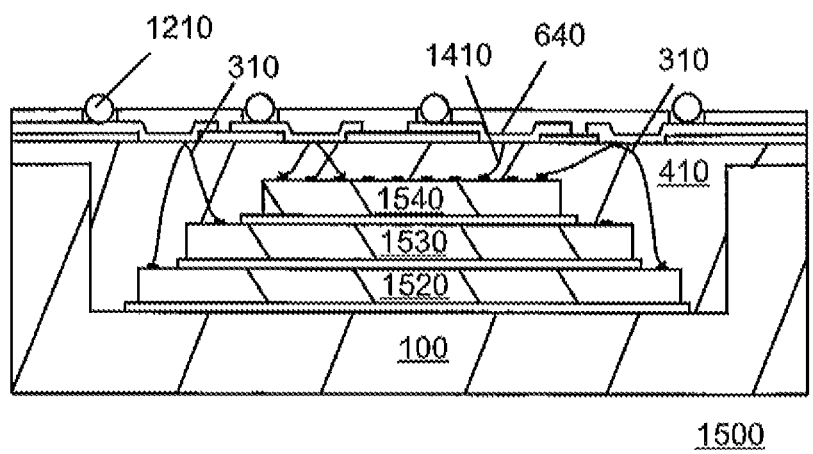
FIG. 15 is a cross-sectional side view of a semiconductor die grid array package, in accordance with a third preferred embodiment of the present invention.

Referring to FIG. 15, there is illustrated a cross-sectional side view of a semiconductor die grid array package 1500, in accordance with a third preferred embodiment of the present invention. The semiconductor die grid array package 1500 is similar to the semiconductor die grid array package 1300 and is made in the same way, therefore to avoid repetition only the differences will described. In this embodiment, the semiconductor die 210 is renamed as a first semiconductor die 1520, and there is a second semiconductor die 1530 with a second semiconductor die mounting surface fixed to the interface surface of the first semiconductor die 1520. There is also a third semiconductor die 1540 with a third semiconductor die mounting surface fixed to the interface surface of the second semiconductor die 1530.

The bond wires 310 selectively connect the external connection pads 240 of the first semiconductor die 1520, second semiconductor die 1530 and third semiconductor die 1540 to selected wire contacting areas 640. Also, the bond wires 310 (bridging wires) selectively interconnect external connection pads of the first semiconductor die 1520 to external connection pads of the second semiconductor die 1530 and similarly the bond wires 310 selectively interconnect external connection pads of the first semiconductor die 1520 to external connection pads of the third semiconductor die 1540. In addition, but not specifically illustrated, the bond wires 310 (bridging wires) may selectively interconnect external connection pads of the second semiconductor die 1530 to external connection pads of the third semiconductor die 1540. In this embodiment, the bond wires 310 include a stump wire 1410 with a first end bonded to the one of the external connection pads of the third semiconductor die 1540 and an opposite second end connected to the wire contacting area 640.

Figure 16:
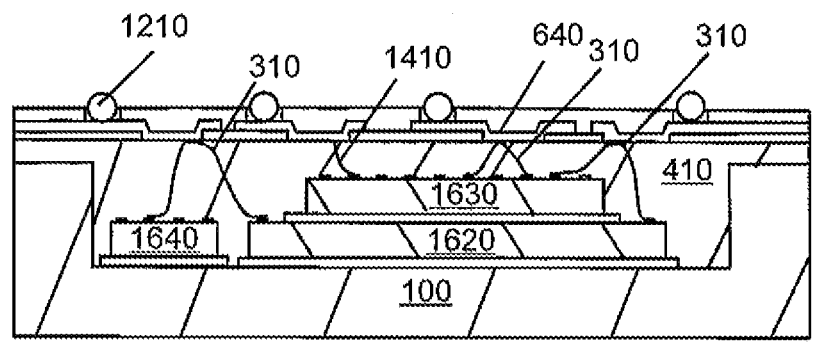
FIG. 16 is a cross-sectional side view of a semiconductor die grid array package, in accordance with a fourth preferred embodiment of the present invention.

Referring to FIG. 16, there is illustrated a cross-sectional side view of a semiconductor die grid array package 1600, in accordance with a third preferred embodiment of the present invention. The semiconductor die grid array package 1600 is similar to the semiconductor die grid array package 1300 and is made in the same way, therefore to avoid repetition only the differences will described. In this embodiment, the semiconductor die 210 is renamed as a first semiconductor die 1620 and there is a second semiconductor die 1630 with a second semiconductor die mounting surface fixed to the interface surface of the first semiconductor die 1620. There is also a third semiconductor die 1640 with a third semiconductor die mounting surface fixed to the cavity floor 130.

The bond wires 310 selectively connect the external connection pads 240 of the first semiconductor die 1620, second semiconductor die 1630 and third semiconductor die 1640 to selected wire contacting areas 640. Also, the bond wires 310 (bridging wires) selectively interconnect external connection pads of the first semiconductor die 1620 to external connection pads of the second semiconductor die 1630 and similarly the bond wires 310 selectively interconnect external connection pads of the first semiconductor die 1620 to external connection pads of the third semiconductor die 1640. In addition, but not specifically illustrated, the bond wires 310 (bridging wires) may selectively interconnect external connection pads of the second semiconductor die 1630 to external connection pads of the third semiconductor die 1640. In this embodiment, the bond wires 310 include a stump wire 1410 with a first end bonded to the one of the external connection pads of the second semiconductor die 1630 and an opposite second end connected to the wire contacting area 640. Typically, as illustrated in this and all of the above embodiments, the die or dies are all situated below the cavity walls 140 which therefore reduces the required amount of molding compound 410.

Figure 17:
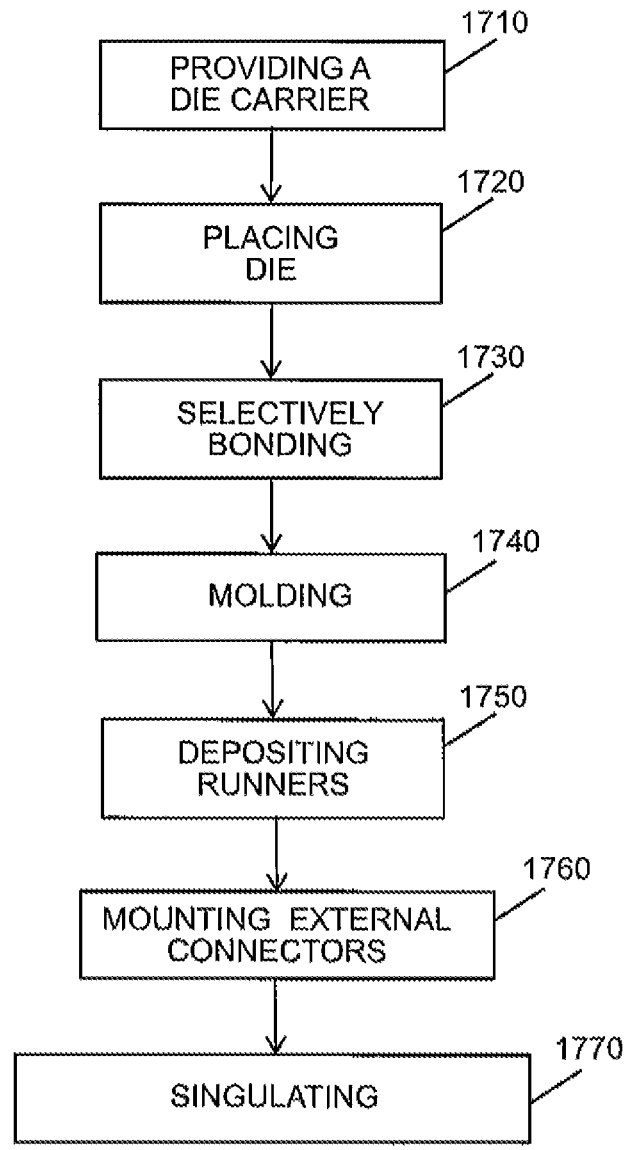
FIG. 17 is a flow chart illustrating a method for manufacturing a semiconductor die grid array package, in accordance with a fifth preferred embodiment of the present invention.

Referring to FIG. 17, a flow chart illustrating a method 1700 for manufacturing a semiconductor die grid array package, in accordance with a fifth preferred embodiment of the present invention, is shown. By way of explanation only, the method 1700 will be described with particular reference to the first embodiment of the semiconductor die grid array package 1300. The method 1700 provides, at a providing block 1710, the die carrier 110 with the cavity 120 that has the cavity floor 130 surrounded by the walls 140. At a placing die block 1720, there is performed a placing of the semiconductor die 210 in the cavity 120 such that the mounting surface 220 of the semiconductor die 210 is fixed to the cavity floor 130. At a selectively bonding block 1730, a process of selectively bonding the bond wires 310 to the external connection pads 240 is performed and then a molding of the second housing member 410 to the die carrier 110 is performed at a molding block 1740. After the molding is completed, the second housing member 410 covers the interface surface 230 and lengths of the bond wires 310.

A process of depositing the electrically conductive runners 1010 is performed at a depositing block 1750. The electrically conductive runners 1010 are deposited to an external surface ES of the second housing member 410, this external surface includes the upper surface 510 and a surface of the dielectric mask 610. The process of depositing further includes grinding the second housing member 410 to expose the wire contacting area 640 of bond wires 310 and partially forming the runners 1010 by selectively depositing the sputter coatings 630 on the external surface ES. Also, the depositing includes the process of plating the sputter coatings 630 with metallic based conductors (typically copper) to thereby provide the electrically conductive runners 1010. As will be apparent to a person skilled in the art, the depositing also includes selectively depositing the dielectric covering 1110 over parts of the electrically conductive runners 1010 in an arrangement so that the dielectric covering 1110 has the apertures 1120 that expose the external connector contacting area 1130 of the runners 1010.

The method 1700 then performs a process, at a mounting block 1760, of mounting the external electrical connectors (solder balls 1210), to a respective external connector contacting area 1130 of the runners 1010. The method 1700 then terminates after a singulating block 1770, in which the die carrier 110 is cut or punched (singulated) from the sheet of die carriers 100 to form, for example, the semiconductor die grid array package 1300 or 1400. Also, as will be apparent to a person skilled in the art the process of placing may also include fixing the second semiconductor die 1530 to the interface surface 230 of the first semiconductor die 1510 to make the semiconductor die grid array package 1500. Also, the method 1700 can be used to manufacture the semiconductor die grid array package 1600.

Advantageously, the present invention provides a relatively inexpensive semiconductor die grid array package that at least alleviates yield problems associated with "resin bleed" as will be apparent to a person skilled in the art.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A semiconductor grid array package, comprising:
a first housing member with a cavity therein, the cavity having a cavity floor at least partially surrounded by cavity walls;
a semiconductor die having a mounting surface and an opposite interface surface with external connection pads, wherein the mounting surface is affixed to the cavity floor;
a second housing member molded to the first housing member and covering at least the interface surface;
a plurality of electrically conductive runners mounted to an external surface of the second housing member, the runners having a wire contacting area and an external connector contacting area;
bond wires selectively bonded to the external connection pads of the semiconductor die and the wire contacting areas of the runners, wherein the bond wires include at least one bridging wire that has a first end bonded to a first one of the external connection pads, an opposite second end bonded to a second one of the external connection pads, and an intermediate section exposed at a same plane of an upper surface of the second housing member and connected to the wire contacting area, wherein part of the intermediate section is removed; and
external electrical connectors mounted to the external connector contacting areas of the runners.

2. The semiconductor grid array package of claim 1, wherein the bridging wire is connected to the wire contacting area by a sputter coating that partially forms the runners.

3. The semiconductor grid array package of claim 1, wherein the bond wires include a stump wire with a first end bonded to one of the external connection pads and an opposite second end connected to the wire contacting area of a selected one of the runners.

4. The semiconductor grid array package of claim 3, wherein the opposite second end of the stump wire is connected to the wire contacting area by a sputter coating that partially forms the runners.

5. The semiconductor grid array package of claim 1, wherein the first housing member is part of a pre-molded die carrier that supports the semiconductor die during wire bonding of the bond wires to the external connection pads.

6. The semiconductor grid array package of claim 1, wherein the semiconductor die is a first semiconductor die and there is a second semiconductor die with a second semiconductor die mounting surface affixed to the interface surface of the first semiconductor die.

7. The semiconductor grid array package of claim 6, wherein the bond wires selectively interconnect external connection pads of the first semiconductor die to external connection pads of the second semiconductor die.

8. The semiconductor grid array package of claim 7, wherein the bond wires selectively connect the external connection pads of the second semiconductor die to the wire contacting areas of the runners.

9. The semiconductor grid array package of claim 6, further comprising a third semiconductor die affixed to the cavity floor.

10. A method for assembling a grid array package, comprising:
   providing a die carrier with a cavity therein, the die carrier providing a first housing member and wherein the cavity has a cavity floor at least partially surrounded by cavity walls;
   placing a semiconductor die in the cavity, the semiconductor die having a mounting surface and an opposite interface surface with external connection pads, wherein the mounting surface is fixed to the cavity floor;
   selectively bonding bond wires to the external connection pads, wherein the bond wires include at least one bridging wire that has a first end bonded to a first one of the external connection pads, and an opposite second end bonded to a second one of the external connection pads;
   molding a second housing member to the die carrier so that the second housing member covers the interface surface and lengths of the bond wires;
   depositing a plurality of electrically conductive runners to an external surface of the second housing member, the runners having a wire contacting area and an external connector contacting area, wherein the bond wires are selectively connected to a said wire contacting area, wherein an intermediate section of the bridging wire is exposed at a same plane of an upper surface of the second housing member and connected to the wire contacting area, wherein said depositing includes removing part of the intermediate section; and
   mounting external electrical connectors to a respective external connector contacting area.

11. The method for assembling a grid array package of claim 10, wherein the depositing includes:
   grinding the second housing member to expose a wire contacting area of the bond wires; and
   partially forming the runners by selectively depositing sputter coatings on the external surface.

12. The method for assembling a grid array package of claim 11, wherein the depositing includes plating the sputter coatings with metallic based conductors to thereby provide the electrically conductive runners.

13. The method for assembling a grid array package of claim 12, wherein the depositing further includes selectively depositing a dielectric covering over parts of the electrically conductive runners, wherein the dielectric covering has apertures therein that expose the external connector contacting area of the runners.

14. The method for assembling a grid array package of claim 11, wherein the die carrier is integrally molded into a sheet of die carriers and the method further includes singulating the die carrier from the sheet of die carriers.

15. The method for assembling a grid array package of claim 14, wherein the die carrier and second housing member form a housing of the grid array package.

16. The method for assembling a grid array package of claim 10, wherein the semiconductor die is a first semiconductor die and the placing further includes affixing a second semiconductor die with a second semiconductor die mounting surface to the interface surface of the first semiconductor die.

* * * * *